(12) United States Patent
Kong et al.

(10) Patent No.: US 8,909,361 B2
(45) Date of Patent: Dec. 9, 2014

(54) METHOD AND SYSTEM FOR PROCESSING HIGH QUALITY AUDIO IN A HARDWARE AUDIO CODEC FOR AUDIO TRANSMISSION

(75) Inventors: Hongwei Kong, Denville, NJ (US); Thirunathan Sutharsan, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 1146 days.

(21) Appl. No.: 12/248,608

(22) Filed: Oct. 9, 2008

(65) Prior Publication Data

US 2010/0057228 A1 Mar. 4, 2010

Related U.S. Application Data

(60) Provisional application No. 61/091,897, filed on Aug. 26, 2008.

(51) Int. Cl.
*G06F 17/00* (2006.01)
*G10L 19/02* (2013.01)
*H03H 17/06* (2006.01)

(52) U.S. Cl.
CPC ............ *G10L 19/02* (2013.01); *H03H 17/0671* (2013.01)
USPC .......................................................... 700/94

(58) Field of Classification Search
USPC .......................................................... 700/94
See application file for complete search history.

(56) References Cited

U.S. PATENT DOCUMENTS

| | | | |
|---|---|---|---|
| 5,659,466 A * | 8/1997 | Norris et al. ..................... | 700/94 |
| 6,141,597 A * | 10/2000 | Botzko et al. .................... | 700/94 |
| 6,185,627 B1 * | 2/2001 | Baker et al. ...................... | 710/1 |
| 6,205,223 B1 * | 3/2001 | Rao et al. ......................... | 380/42 |
| 6,259,957 B1 * | 7/2001 | Alexander et al. .............. | 700/94 |
| 6,438,434 B1 * | 8/2002 | Kamiya ........................... | 700/94 |
| 6,487,535 B1 * | 11/2002 | Smyth et al. ................... | 704/500 |
| 6,717,533 B2 * | 4/2004 | Seaberg et al. ................. | 341/61 |
| 6,754,618 B1 * | 6/2004 | Konstantinides et al. . | 704/200.1 |
| 6,823,353 B2 * | 11/2004 | Fischer et al. ................. | 708/622 |
| 6,993,546 B2 * | 1/2006 | Nally et al. .................... | 708/313 |
| 7,139,330 B1 * | 11/2006 | May .............................. | 375/316 |

(Continued)

OTHER PUBLICATIONS

Viewcast Niagara Pro: users guide copyright 2007 and available for sale at least Sep. 23, 2007; http://web.archive.org/web/20070923185909/http://www.viewcast.com/.*

(Continued)

*Primary Examiner* — Paul McCord
(74) *Attorney, Agent, or Firm* — Sterne, Kessler, Goldstein & Fox PLLC

(57) ABSTRACT

Aspects of a method and/or system for processing high quality audio in a hardware audio CODEC for audio transmission are provided. In this regard, an audio signal may be downsampled via a cascaded plurality of filters and sample rate converters in the hardware audio CODEC. Additionally, a portion of each sample of the audio signal may be selected based on an origin of the audio signal. The selected portion of each sample of the audio signal may comprise 16 or 18 bits. The selected portion may be determined based on a type, a class, a manufacturer identifier, and/or a model identifier of the origin the audio signal. Coefficients of the filters may be configured based on the origin of the audio signal. One or more of the filters may comprise one or more cascaded biquads. The sample rate converters may comprise one or more CIC decimation filters.

31 Claims, 9 Drawing Sheets

(56) References Cited

U.S. PATENT DOCUMENTS

| | | | |
|---|---|---|---|
| 7,215,820 B2* | 5/2007 | Zandi et al. | 382/240 |
| 7,233,268 B1* | 6/2007 | Lin et al. | 341/61 |
| 7,423,563 B2* | 9/2008 | Zucker | 341/100 |
| 7,463,170 B2 | 12/2008 | Kong et al. | |
| 7,515,071 B2 | 4/2009 | Kong et al. | |
| 7,619,551 B1* | 11/2009 | Wu | 341/143 |
| 7,633,417 B1* | 12/2009 | Yeh | 341/131 |
| 7,734,146 B1* | 6/2010 | Nguyen et al. | 386/343 |
| 7,912,728 B2* | 3/2011 | Kong et al. | 704/500 |
| 8,019,449 B2* | 9/2011 | Barzegar et al. | 700/94 |
| 2003/0021429 A1* | 1/2003 | Ratcliff et al. | 381/119 |
| 2003/0171882 A1* | 9/2003 | Thielman et al. | 702/64 |
| 2003/0191548 A1* | 10/2003 | McPherson et al. | 700/94 |
| 2004/0081259 A1* | 4/2004 | Ammer et al. | 375/340 |
| 2004/0125878 A1* | 7/2004 | Liljeryd et al. | 375/242 |
| 2005/0136848 A1 | 6/2005 | Murray | |
| 2005/0209718 A1* | 9/2005 | Lin | 700/94 |
| 2005/0228995 A1* | 10/2005 | Kwak et al. | 713/168 |
| 2006/0182007 A1* | 8/2006 | Konetski | 369/275.1 |
| 2006/0239642 A1* | 10/2006 | Yuasa et al. | 386/83 |
| 2007/0081597 A1* | 4/2007 | Disch et al. | 375/242 |
| 2007/0133826 A1* | 6/2007 | Burk et al. | 381/122 |
| 2007/0244587 A1* | 10/2007 | Yamamoto | 700/94 |
| 2007/0255433 A1* | 11/2007 | Choo | 700/94 |
| 2007/0263985 A1* | 11/2007 | Ikeda et al. | 386/96 |
| 2008/0080723 A1* | 4/2008 | Kim et al. | 381/119 |
| 2008/0130913 A1 | 6/2008 | Kong | |
| 2008/0130916 A1 | 6/2008 | Kong | |
| 2008/0133224 A1 | 6/2008 | Kong | |
| 2008/0319740 A1* | 12/2008 | Su et al. | 704/225 |
| 2009/0055455 A1* | 2/2009 | Matsuyama et al. | 708/231 |

OTHER PUBLICATIONS

Metering FrequenctlyAsked Questions: copyright 2000; http://www.soundonsound.com/sos/jun00/articles/metring.htm.*

* cited by examiner ary audio in a hardware audio CODEC for audio transmission

CROSS-REFERENCE TO RELATED APPLICATIONS/INCORPORATION BY REFERENCE

This application makes reference to, claims priority to and claims benefit from U.S. Provisional Patent Application Ser. No. 61/091,897 filed on Aug. 26, 2008.

This application makes reference to U.S. Provisional Patent Application Ser. No. 61/074,012, filed on Jun. 19, 2008.

Each of the above stated applications is hereby incorporated herein by reference in its entirety.

FIELD OF THE INVENTION

Certain embodiments of the invention relate to processing of audio signals. More specifically, certain embodiments of the invention relate to a method and system for processing high quality audio in a hardware audio CODEC for audio transmission.

BACKGROUND OF THE INVENTION

In audio applications, systems that provide audio interface and processing capabilities may be required to support duplex operations, which may comprise the ability to collect audio information through a sensor, microphone, or other type of input device while at the same time being able to drive a speaker, earpiece of other type of output device with processed audio signal. In order to carry out these operations, these systems may utilize audio coding and decoding (codec) devices that provide appropriate gain, filtering, and/or analog-to-digital conversion in the uplink direction to circuitry and/or software that provides audio processing and may also provide appropriate gain, filtering, and/or digital-to-analog conversion in the downlink direction to the output devices.

As audio applications expand, such as new voice and/or audio compression techniques and formats, for example, and as they become embedded into wireless systems, such as mobile phones, for example, novel codec devices may be needed that may provide appropriate processing capabilities to handle the wide range of audio signals and audio signal sources. In this regard, added functionalities and/or capabilities may also be needed to provide users with the flexibilities that new communication and multimedia technologies provide. Moreover, these added functionalities and/or capabilities may need to be implemented in an efficient and flexible manner given the complexity in operational requirements, communication technologies, and the wide range of audio signal sources that may be supported by mobile phones.

The audio inputs to mobile phones may come from a variety of sources, at a number of different sampling rates, and audio quality. Polyphonic ringers, voice, and high quality audio, such as music, are sources that are typically processed in a mobile phone system. The different quality of the audio source places different requirements on the processing circuitry, thus dictating flexibility in the audio processing systems.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for processing high quality audio in a hardware audio CODEC for audio transmission, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for processing high quality audio in a hardware audio CODEC for audio transmission. In various embodiments of the invention, an audio signal may be down-sampled via a cascaded plurality of filters and sample rate converters in the hardware audio CODEC. Additionally, a portion of each sample of the audio signal may be selected based on an origin of the audio signal. In an exemplary embodiment of the invention, the selected portion of each sample of the audio signal may comprise 16 or 18 bits. The selected portion of the audio signal may be determined based on a type, a class, a manufacturer identifier, and/or a model identifier of the origin of the audio signal. Exemplary origin types may comprise a digital microphone, an analog microphone, and a line-in jack. Exemplary origin classes may comprise high speed device, low speed device, high power device, or low power device. Coefficients of the filters may be configured based on the origin of the audio signal. The filters may comprise one or more IIR filters. One or more of the filters may comprise one or more cascaded biquads. The sample rate converters may comprise one or more CIC decimation filters. The audio signal may be down-sampled to 48 kHz.

Figure 1:
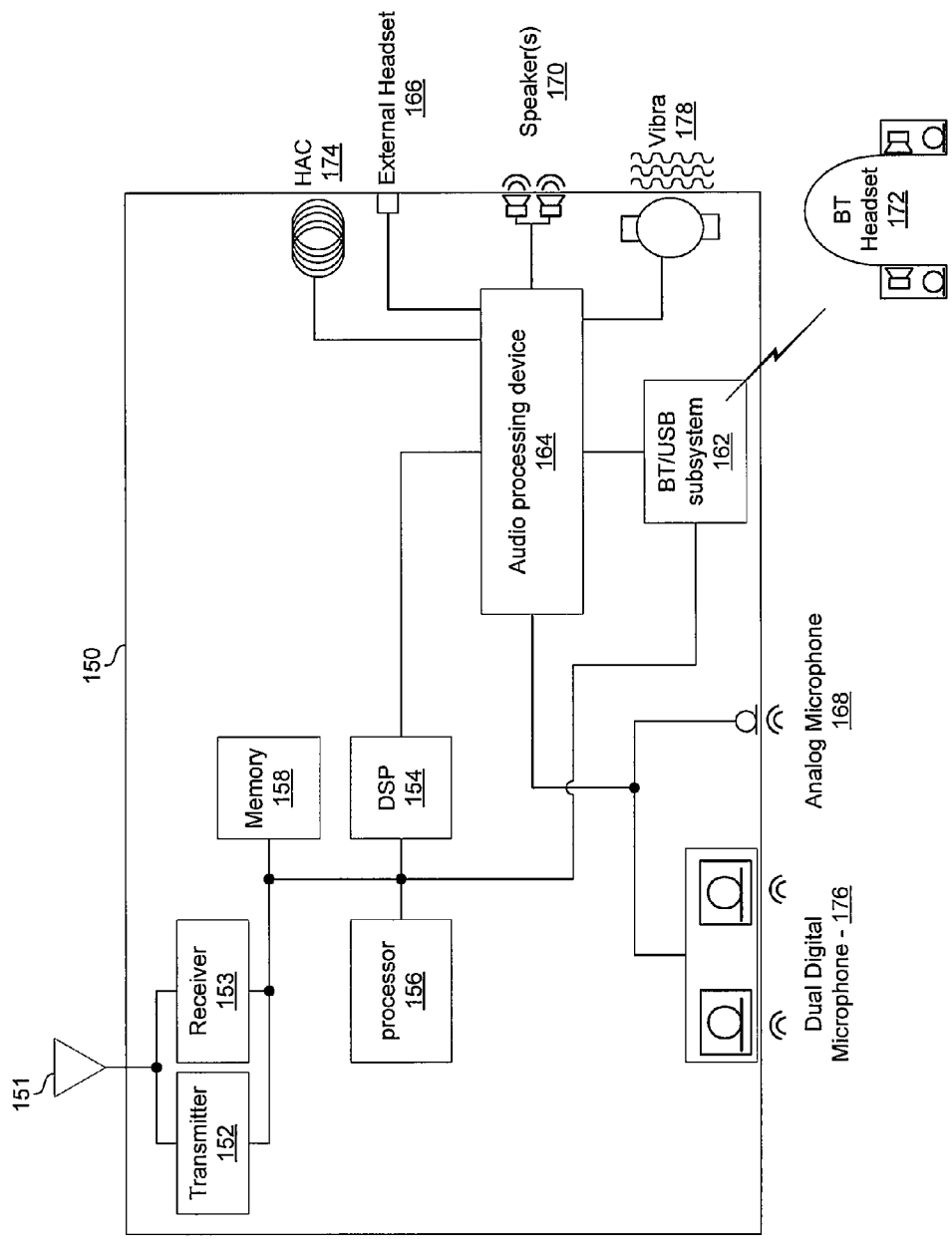
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a transmitter 152, a receiver 153, a digital signal processor 154, a processor 156, a memory 158, a Bluetooth (BT) subsystem 162, an audio processing device 164, an external headset port 166, an analog microphone 168, speaker(s) 170, a Bluetooth headset 172, a hearing aid compatibility (HAC) coil 174, a dual digital microphone 176, and a vibration transducer 178. The antenna 151 may be used for reception and/or transmission of RF signals. Different wireless systems may use different antennas for transmission and reception.

The transmitter 152 may comprise suitable logic, circuitry, and/or code that may be operable to modulate and up-convert baseband signals to RF signals for transmission by one or more antennas, which may be represented generically by the antenna 151. The transmitter 152 may be operable to execute other functions, for example, filtering the baseband and/or RF signals, and/or amplifying the baseband and/or RF signals. Although a single transmitter 152 is shown, the invention is not so limited. Accordingly, there may be a plurality of transmitters and/or receivers. In this regard, the plurality of transmitters may enable the wireless system 150 to handle a plurality of wireless protocols and/or standards including cellular, wireless local area networking (WLAN), and personal area networking (PAN). In addition, the transmitter 152 may be combined with the receiver 153 and implemented as a combined transmitter and receiver (transceiver).

The receiver 153 may comprise suitable logic, circuitry, and/or code that may be operable to down-convert and demodulate received RF signals to baseband signals. The RF signals may be received by one or more antennas, which may be represented generically by the antenna 151. The receiver 153 may be operable to execute other functions, for example, filtering the baseband and/or RF signals, and/or amplifying the baseband and/or RF signals. Although a single receiver 153 is shown, the invention is not so limited. Accordingly, there may be a plurality of receivers. In this regard, the plurality of receivers may enable the wireless system 150 to handle a plurality of wireless protocols and/or standards including cellular, WLAN, and PAN. In addition, the receiver 153 may be implemented as a separate transmitter and a separate receiver.

The DSP 154 may comprise suitable logic, circuitry, and/or code that may be operable to process audio signals. In various embodiments of the invention, the DSP 154 may encode, decode, modulate, demodulate, encrypt, and/or decrypt audio signals. In this regard, the DSP 154 may be operable to perform computationally intensive processing of audio signals.

The processor 156 may comprise suitable logic, circuitry, and/or code that may be operable to configure and/or control one or more portions of the system 150, control data transfers between portions of the system 150, and/or otherwise process data. Control and/or data information may be transferred between the processor 156 and one or more of the transmitter 152, the receiver 153, the DSP 154, the memory 158, the audio processing device 164, and the BT and/or USB subsystem 162. The processor 156 may be utilized to update and/or modify programmable parameters and/or values in one or more of the transmitter 152, the receiver 153, the DSP 154, the memory 158, the audio processing device 164, and the BT and/or USB subsystem 162. In this regard, a portion of the programmable parameters may be stored in the system memory 158. The processor 156 may be any suitable processor or controller. For example, the processor 156 may be a reduced instruction set computing (RISC) microprocessor such as an advanced RISC machine (ARM), advanced virtual RISC (AVR), microprocessor without interlocked pipeline stages (MIPS), or programmable intelligent controller (PIC).

The system memory 158 may comprise suitable logic, circuitry, and/or code that may be operable to store a plurality of control and/or data information, including parameters needed to configure one or more of the transmitter 152, the receiver 153, the DSP 154, and/or the audio processing device 164. The system memory 158 may store at least a portion of the programmable parameters that may be manipulated by the processor 156.

In an exemplary embodiment of the invention, the DSP 154 and processor 156 may exchange audio data and control information via the memory 158. For example, the processor 156 may write encoded audio data, such as MP3 or MC audio, to the memory 158 and the memory may pass the encoded audio data to the DSP 154. Accordingly, the DSP 154 may decode the data and write pulse-code modulated (PCM) audio back into the shared memory for the processor 156 to access and/or to be delivered to the audio processing device 164.

The BT and/or USB subsystem 162 may comprise suitable circuitry, logic, and/or code that may be operable to transmit and receive Bluetooth and/or Universal Serial Bus (USB) signals. The BT and/or USB subsystem 162 may be operable to up-convert, down-convert, modulate, demodulate, and/or otherwise process BT and/or USB signals. In this regard, the BT and/or USB subsystem 162 may handle reception and/or transmission of BT and/or USB signals via a wireless communication medium and/or handle reception and/or transmission of USB signals via a wireline communication medium. Information and/or data received via a BT and/or USB connection may be communicated between the BT and/or USB subsystem 162 and one or more of the transmitter 152, the receiver 153, the DSP 154, the processor 156, the memory 158, and the audio processing device 164. For example, the BT and/or USB subsystem 162 may extract audio from a received BT and/or USB signal and may convey the audio to other portions of the wireless system 150 via an inter-IC sound (I²S) bus. Information and/or data may be communicated from one or more of the transmitter 152, the receiver 153, the DSP 154, the processor 156, the memory 158, and the audio processing device 164 to the BT and/or USB subsystem 162 for transmission over a BT and/or USB connection. For example, audio signals may be received from other portions of the wireless system 150 via an I²S bus and the audio signal may be transmitted via a BT and/or USB connection. Additionally, control and/or feedback information may be communicated between the BT and/or USB subsystem 162 and one or more of the transmitter 152, the receiver 153, the DSP 154, the processor 156, the memory 158, and the audio processing device 164.

The audio processing device 164 may comprise suitable circuitry, logic, and/or code that may process audio signals received from and/or communicated to input and/or output devices. The input devices may be within or communicatively coupled to the wireless device 150, and may comprise, for example, the analog microphone 168, the stereo speakers 170, the Bluetooth headset 172, the hearing aid compatible (HAC) coil 174, the dual digital microphone 176, and the vibration transducer 178. The audio processing device 164 may up-sample and/or down-sample audio signals to one or more desired sample rates for communication to an audio output device, the DSP 154, and/or the BT and/or USB subsystem 162. In this regard, the CODEC 164 may comprise one or more decimation filters and/or sample rate converters which may be operable to down-convert a sampling frequency of one or more audio signals. Additionally, the decimation filters may be operable to adjust a gain of the down-sampled signals. The audio processing device 164 may be enabled to handle a plurality of data sampling rate inputs. For example, the audio processing device 164 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The audio processing device 164 may be enabled to handle a plurality of digital audio inputs of various resolutions, such as 16 or 18-bit resolution, for example. The audio processing device 164 may support mixing of a plurality of audio sources. For example, the audio processing device 164 may support audio sources such as general audio, polyphonic ringer, I²S FM audio, vibration driving signals, and voice. In an exemplary embodiment of the invention, the general audio and polyphonic ringer sources may support the plurality of sampling rates that the audio processing device 164 may be enabled to accept, while the voice source may support a portion of the plurality of sampling rates, such as 8 kHz and 16 kHz.

The audio processing device 164 may utilize a programmable infinite impulse response (IIR) filter and/or a programmable finite impulse response (FIR) filter for at least a portion of the audio sources to compensate for passband amplitude and phase fluctuation for different input and/or output devices. In this regard, filter coefficients may be configured or programmed dynamically based on operations. Moreover, filter coefficients may all be switched in one-shot or may be switched sequentially, for example. The audio processing device 164 may also utilize a modulator, such as a Delta-Sigma (ΔΣ) modulator, for example, to code digital output signals for analog processing. The audio processing device 164 may be referred to, for example, as an audio coding and/or decoding device or CODEC. In various embodiments of the invention, the audio processing device 164 may be implemented in dedicated hardware.

The external headset port 166 may comprise a physical connection for an external headset to be communicatively coupled to the wireless system 150. The headset may, for example, be an analog headset comprising a microphone and a pair of stereo transducers. Alternatively, the headset may be a digital headset which may utilize a protocol such as USB for communicating audio information.

The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The speaker(s) 170 may comprise one or more speakers that may be operable to generate acoustic waves from electrical signals received from the audio processing device 164. In an exemplary embodiment of the invention, there may be a pair of speakers which may be operable to output acoustic waves corresponding to, for example, left and right stereo channels.

The Bluetooth headset 172 may comprise a wireless headset that may be communicatively coupled to the wireless system 150 via the BT and/or USB subsystem 162. In this manner, the wireless system 150 may be operated in a hands-free mode, for example.

The HAC coil 174 may comprise suitable circuitry, logic, and/or code that may enable communication between the wireless device 150 and a hearing aid, for example. In this regard, audio signals may be magnetically coupled from the HAC coil 174 to a coil in a user's hearing aid.

The dual digital microphone 176 may comprise suitable circuitry, logic, and/or code that may detect sound waves and convert them to electrical signals. The electrical signals generated by the dual digital microphone 176 may comprise digital signals, and thus may not require analog to digital conversion prior to digital processing in the audio processing device 164.

The vibration transducer 178 may comprise suitable circuitry, logic, and/or code that may be operable to notify a user of an incoming call, alerts and/or message to the wireless device 150 without the use of sound. The vibration transducer may generate vibrations that may be in synch with, for example, audio signals such as speech or music.

In operation, audio signals from the receiver 153, the processor 156, and/or the memory 158 may be conveyed to the DSP 154. The DSP 154 may process the signals to generate output baseband audio signals to the audio processing device 164. Additionally, baseband audio signals may be conveyed from the BT and/or USB subsystem 162, the analog microphone 168, and/or the digital microphone 176, to the audio processing device 164. In various embodiments of the invention, the audio signals from the analog microphone 168 and the digital microphone 176 may share processing circuitry within the DSP 154. Accordingly, digital gain control may be applied in the audio processing device 164 such that voltage and/or power levels of audio signals from the digital microphone 168 may be matched to voltage and/or power levels of audio signals from the analog microphone 168.

The audio processing device 164 may process and/or condition one or more of the baseband audio signals to make them suitable for conveyance to the DSP and subsequent transmission to a remote wireless device. The audio processing device 164 may up-convert and/or down-convert a sampling frequency of audio signals received from multiple audio inputs and/or sources. In this regard, a cascaded plurality of filters and down-samplers may be utilized to down-sample audio signals without need of a polynomial interpolator. Additionally, the audio processing device 164 may digitally adjust voltage and/or power levels of audio signals received from multiple audio inputs and/or sources.

Figure 2:
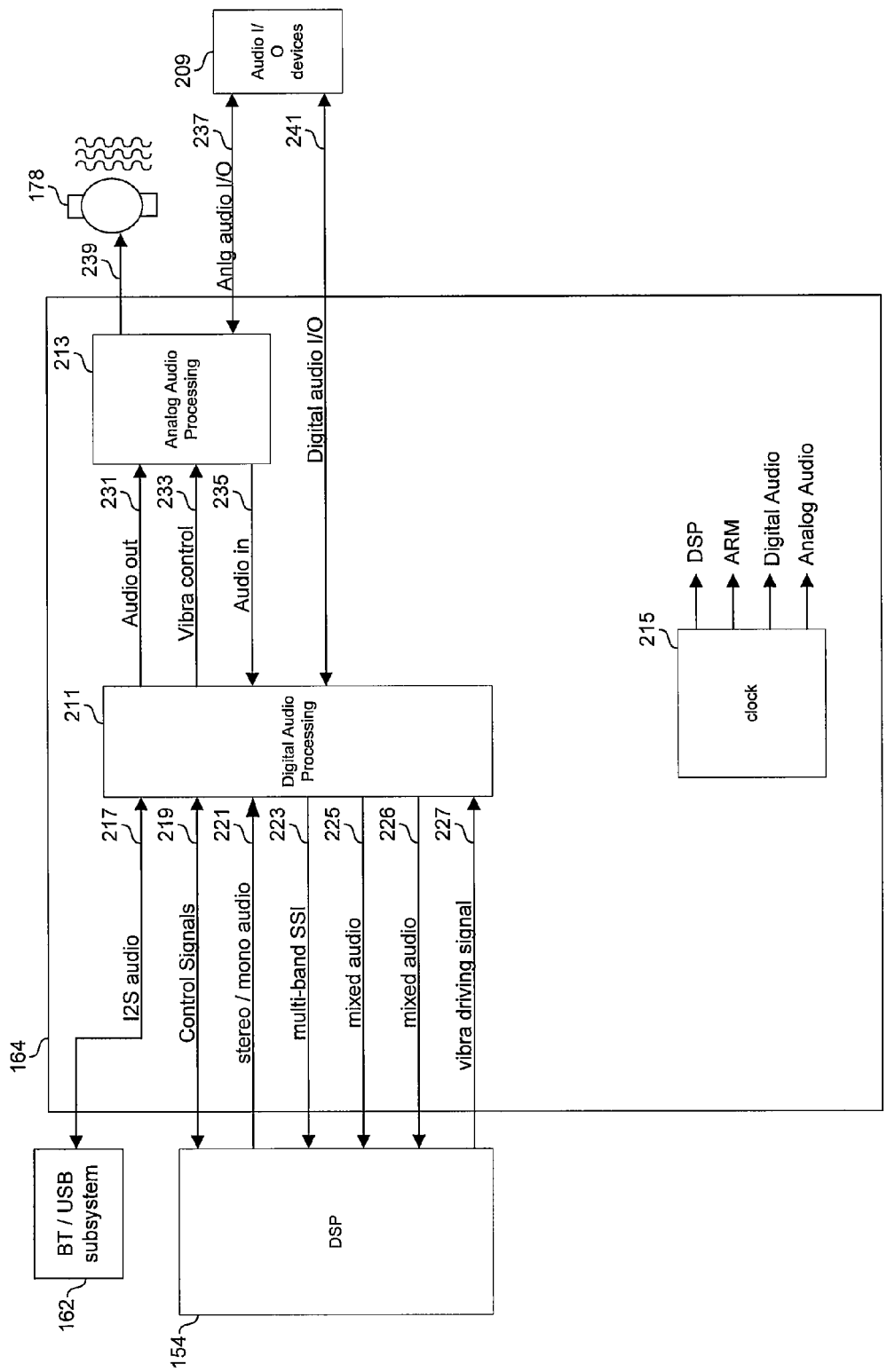
FIG. 2 is a block diagram illustrating an exemplary audio CODEC interconnection, in accordance with an embodiment of the invention.

FIG. 2 is a block diagram illustrating an exemplary audio processing device, in accordance with an embodiment of the invention. Referring to FIG. 2, there is shown the DSP 154, the BT and/or USB subsystem 162, the audio processing device 164, and audio input and/or output devices 209. The audio input and/or output devices 209 may comprise one or more devices such as the external headset port 166, the analog microphone 168, the speakers 170, the Bluetooth headset 172, the hearing aid compatibility (HAC) coil 174, the dual digital microphone 176, and the vibration transducer 178 described with respect to FIG. 1. The DSP 154 and the BT and/or USB subsystem 162 may be as described with respect to FIG. 1. The audio processing device 164 may be as described with respect to FIG. 1 and may comprise a digital portion 211, an analog portion 213, and a clock 215.

The digital portion 211 may comprise suitable logic, circuitry, and/or code that may enable processing audio signals in the digital domain. In this regard, the digital portion 211 may be operable to filter, buffer, up-sample, down-sample, apply a digital gain or attenuation to, route, and/or otherwise condition digital audio signals. Additional details of the digital portion 211 are described below with respect to FIGS. 3-8.

The analog portion 213 may comprise suitable logic, circuitry, and/or code that may enable converting digital audio signals to an analog representation and amplifying and/or buffering the analog signals for driving audio output devices. Additional details of the analog portion 213 are described below with respect to FIG. 3.

The clock 215 may comprise suitable logic, circuitry, and/or code that may be operable to generate one or more periodic signals. The clock 215 may, for example, comprise one or more crystal oscillators, phase locked loops (PLLs), and/or direct digital frequency synthesizers (DDFS). The clock 215 may output a plurality of signals each with a distinct frequency and/or phase. The signals output by the clock 215 may be conveyed to one or more of the digital portion 211, the analog block 213, the DSP 154, the memory 158, and/or the processor 156.

In various exemplary embodiments of the invention, one or more audio signals 217 may be communicated between the digital portion 211 and the BT and/or USB subsystem 162 via an inter-IC sound ($I^2S$) bus. Each of the audio signals 217 may be a monaural channel, a left stereo channel, or a right stereo channel. In an exemplary embodiment of the invention, the BT and/or USB subsystem 162 may be enabled to receive and/or process audio broadcasts, and thus, two signals 217 comprising left and right channel audio may be conveyed to the digital portion 211 via an $I^2S$ bus. In this regard, exemplary audio broadcasts may comprise FM stereo, "HD radio", DAB, DAB+, and satellite radio broadcasts.

In various exemplary embodiments of the invention, one or more output audio signals 231, vibration control 233, and input audio signals 235 may be communicated between the digital portion 211 and the analog portion 213.

The output audio signals 231 may each comprise one or more digital audio signals which have been suitably processed and/or conditioned by the digital portion 211 for output via one or more of the audio output devices 209. Each of the audio signals 231 may be a monaural channel, a left stereo channel, or a right stereo channel. Each of the output audio signals 231 may be converted to an analog representation and amplified by the analog portion 213.

The input audio signals 235 and 241 from an audio input device 209 may each comprise one or more digital audio signals to be processed by the digital portion 211. The input audio signals 235 and/or 241 may comprise monaural and/or stereo audio data which the digital portion 211 may process for conveyance to the DSP 156 and subsequent transmission to a remote wireless device. In this regard, the digital portion may down-sample the input audio signals 235 and/or 241 and/or may adjust voltage and/or power levels of the input audio signals 235 and/or 241. The input audio signals 235 and/or 241 may comprise monaural and/or stereo audio data which the digital portion 211 may process in a "loopback" path for conveyance to one or more audio output devices 209.

The vibration control signal 233 may be a pulse width modulated square wave that may, after being amplified by the analog processing block 213, control vibration of the vibration transducer 178. In various exemplary embodiments of the invention, spectral shaping techniques may be applied in the pulse width modulation function, after the amplifier block 213, to reduce noise in the audible band.

In various exemplary embodiments of the invention, one or more control signals 219, one or more audio signals 221, one or more SSI signals 223, one or more mixed audio signals 225 and/or 226, and one or more signals 227 for driving a vibration transducer may be communicated between the DSP 154 and the digital portion 211. Monaural and/or stereo audio data may be extracted from RF signals received by the receiver 153 and processed by the DSP block 154 before being conveyed to the digital portion 211 of the processing device 164. One or more signals communicated between the DSP 154 and the digital portion 211 may be buffered. For example, voice signals may not be buffered while music and/or ringtone signals may be written to a first-in-first-out (FIFO) buffer by the DSP 154 and then fetched from the FIFO by the digital portion 211.

The one or more control signals 219 may be utilized to configure various operations of the digital portion 211 based, for example, on a resolution and/or sampling rate of signals being output by the DSP 154. In various embodiments of the invention, one or more control registers for the digital portion 211 may reside in the DSP 154. In various embodiments of the invention, the control signals 219 may comprise one or more interrupt signals.

The audio signals 221 may each comprise, for example, voice data, music data, or ringtone data. Each audio signal 221 may be monaural signal, a left stereo channel, or a right stereo channel. The digital portion 211 may condition and/or process the audio signals 221 for conveyance to one or more audio output devices and/or uplink paths. In various embodiments of the invention, the resolution and/or sample rate of the audio signals 221 may vary. Exemplary resolutions may comprise 16-bit and 18-bit resolution. Exemplary sample rates may comprise 8 kHz, 11.05 kHz, 12 kHz, 16 kHz, 22.05 kHz, 24 kHz, 32 kHz, 44.1 kHz, and 48 kHz.

The signal strength indicator (SSI) signals 223 may comprise one or more feedback signals from the digital portion 211 to the DSP 154. The SSI signals 223 may provide an indication of signal strength of one or more frequency bands of one or more audio signals 221, 225, and/or 226. The SSI signals 223 may, for example, be utilized by the DSP 154, the processor 156, the memory 158, or a combination thereof to control a digital gain factor applied to each sub-band of one or more audio signals 221, 225, and/or 226.

The signal 227 may comprise audio data utilized to control a vibration transducer 178. The signal 227 may comprise, for example, CW tone data, voice data, music data, or ringtone data. Characteristics such as intensity of vibration, a pattern in which vibration may be started and stopped, a frequency at which vibration may be started and/or stopped, and/or a duration of a vibration or sequence of vibrations may be controlled based on the signal 227.

The one or more mixed audio signals 225 and the one or more mixed audio signals 226 may be output by the digital portion 211 to the DSP 154. The mixed audio signals 225 may each be a composite signal comprising information from one or more monaural signals and/or stereo audio signals. Similarly, the mixed audio signals 226 may each be a composite signal comprising information from one or more monaural signals and/or stereo audio signals. In this regard, one or more of the audio signals 221, one or more of the input audio signals 235, one or more of the input audio signals 241, and/or one or more of the audio signals 217 may be mixed together. Each of the audio signals 221, 235, 241, and 217 may be, for example, amplified, attenuated, band limited, up-converted, down-converted or otherwise processed and/or conditioned prior to mixing. The mixed audio signals 225 may be part of and/or coupled to an uplink path. For example, the signals 225 may be processed by the DSP 154 and transmitted, via the BT and/or USB subsystem 162, to a remote wireless system. Similarly, the mixed audio signal) 226 may be part of and/or coupled to an uplink path. For example, the signals 226 may be processed by the DSP 154 and transmitted, via the transmitter 152, to a far-end communication partner or a remote wireless system.

In operation, one or more baseband audio signals 217, 221, 235, and/or 241 may be conveyed to the audio processing device 164 from one or more of the DSP 154, the BT subsystem 162, and the input and/or output devices 209. The digital portion 211 of the audio processing device 164 may select which baseband audio signals 221 to process. Each of the selected audio signals may be processed based on factors such as whether the signal may be one of a pair of stereo signals or may be a monaural signal; whether the signal comprises voice, music, or ringtone data; a resolution of the signal; and a sample rate of the signal. Voltage and/or power levels and/or sample frequency of input audio signals may be adjusted prior to communicating the signals to the audio processing device 164. In this regard, audio signals input to the audio processing device may be down-sampled via a cascade of filters and down-samplers. For example, one or more cascade-integrate-comb decimation filters, one or more IIR filters, and one or more IIR filters may be utilized to down-sample audio signals. In this manner, audio signals may be down sampled without the need for a polynomial interpolation filter, which may be complicated and/or expensive to implement.

Figure 3:
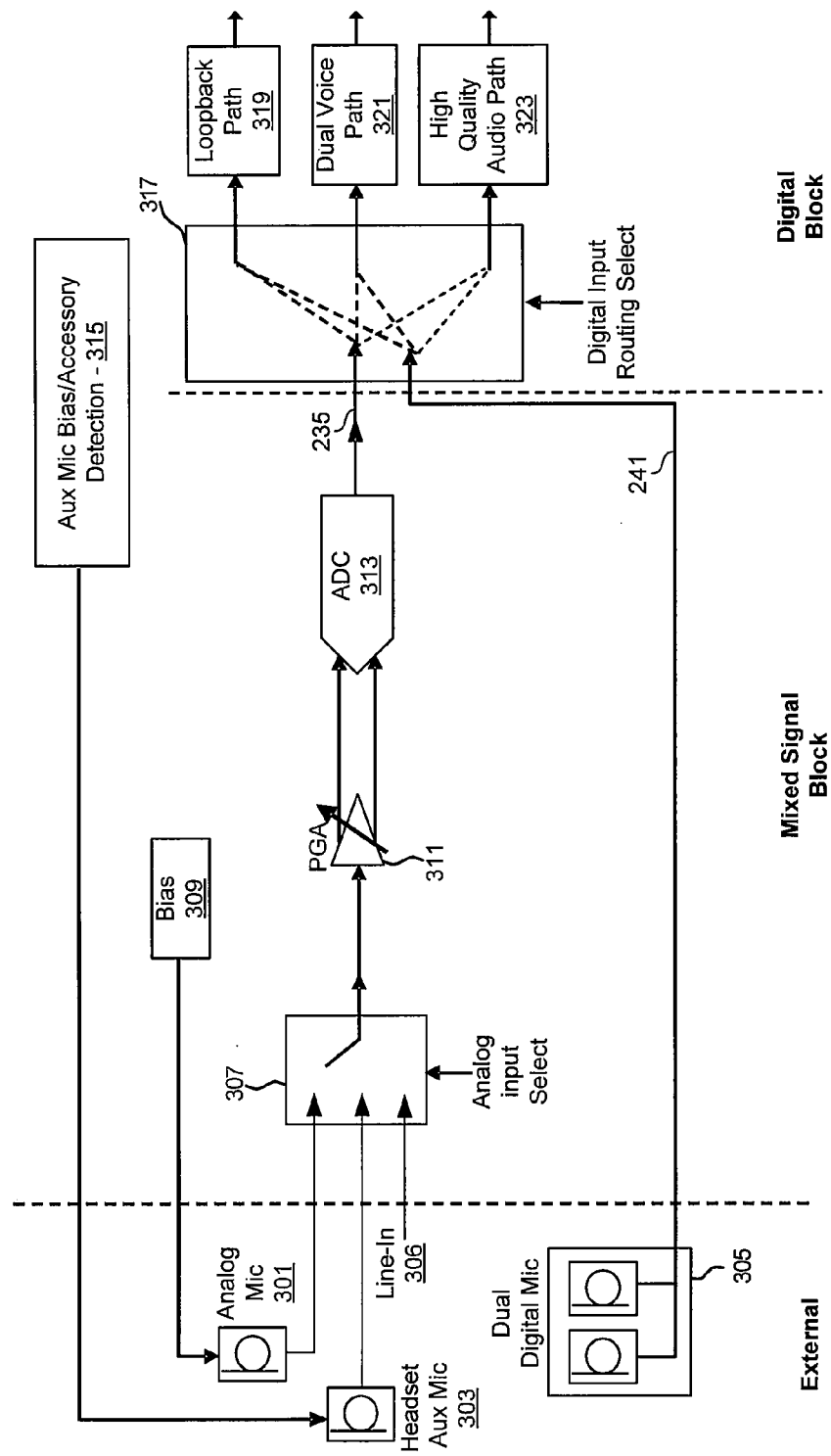
FIG. 3 is a block diagram of an exemplary audio transmit processing system in accordance with an embodiment of the invention.

FIG. 3 is a block diagram of an exemplary audio transmit processing system in accordance with an embodiment of the invention. Referring to FIG. 3, there is shown an analog microphone 301, a headset auxiliary microphone 303, a dual digital microphone 305, an analog input select switch 307, a bias circuit 309, a programmable gain amplifier (PGA) 311, an analog to digital converter (ADC) 313, an auxiliary microphone bias and accessory detection block 315, a digital input routing switch 317, a loopback path 319, dual voice path 321, and high quality audio path 323. There is also shown an analog input select signal and a digital input routing select signal.

The analog microphone 301, the headset auxiliary microphone 303, and the dual digital microphone 305 may be located external to the CODEC 164, described with respect to FIG. 2. The bias circuit 309, the analog input select switch 307, the PGA 311, and the ADC 313 may comprise a mixed-signal block in the CODEC 164, whereas the digital input routing switch 317, the loopback filters 319, and the filters 321 and 323 may comprise a digital block in the CODEC 164. The auxiliary microphone bias and accessory detection block 315 may comprise circuitry within the mixed signal and the digital blocks of the CODEC 164.

The analog microphone 301 may comprise suitable circuitry, logic, and/or code that may be operable to detect sound waves and convert them to electrical signals via a piezoelectric effect, for example. The electrical signals generated by the analog microphone 301 may comprise analog signals that may require analog to digital conversion before processing. The analog microphone 301 may be integrated in a wireless system, such as the wireless system 150 described with respect to FIG. 1.

The headset auxiliary microphone 303 may comprise suitable circuitry, logic, and/or code that may be operable to detect sound waves and convert them to electrical signals via a piezoelectric effect, for example. The electrical signals generated by the auxiliary microphone 303 may comprise analog signals that may require analog to digital conversion before processing. The headset auxiliary microphone 303 may be integrated in a headset that may be communicatively coupled with the wireless system 150.

The dual digital microphone 305 may comprise suitable circuitry, logic, and/or code that may be operable to detect sound waves and convert them to electrical signals. The electrical signals generated by the dual digital microphone 305 comprise digital signals, at 1.625 MHz or 3.25 MHz, for example, and thus may not require analog to digital conversion prior to digital processing. The dual digital microphone 305 may comprise a micro-electromechanical systems (MEMS) microphone, for example.

The analog input select switch 307 may comprise suitable circuitry, logic, and/or code that may be operable to select which analog source signal may be communicated to the PGA 311. The analog input select switch 307 may receive as inputs the analog signals generated by the analog microphone 301, the headset auxiliary microphone 303, and the line-in 306. The analog input select signal may determine which of the analog signals to communicate to the PGA 311. In this manner, multiple analog sources may be utilized while only requiring one ADC, the ADC 313. The invention is not limited to the number of analog sources shown in FIG. 3. Accordingly, the number of microphones or other input sources may be any number as required by the wireless system 150.

The bias circuit 309 may comprise suitable circuitry, logic, and/or code that may be operable to bias the analog microphone 301 for proper operation. The auxiliary microphone bias and accessory detection block 315 may comprise circuitry, logic, and/or code that may determine when the headset auxiliary microphone 303 may be present and may then bias accordingly for proper operation.

The ADC 313 may comprise suitable circuitry, logic, and/or code that may convert an analog signal to a digital signal. The ADC 313 may receive as an input signal, the signal generated by the PGA 311, and may communicate an output digital signal to the digital input routing switch 317. The ADC 313 may comprise a second-order delta-sigma modulator, for example.

The digital input routing switch 317 may comprise suitable circuitry, logic, and/or code that may be operable to select which digital source signal may be communicated to the loopback path 319, the dual voice path 321, and the high quality audio path 323. The digital input routing switch 317 may receive as inputs the digital signals generated by the ADC 313 and the dual digital microphone 305, as well as the digital input routing select signal to determine where each of the digital signals may be directed. In this manner, multiple digital sources may be utilized while only requiring a single loopback path. The invention is not limited to the number of digital sources shown in FIG. 3. Accordingly, the number of digital microphones or other digital input sources may be any number as required by the wireless system 150.

The loopback path 319 may comprise suitable circuitry, logic, and/or code that may enable processing up to four audio signals for conveyance to an audio output device. The loopback path 319 may comprise one or more filters and/or sample rate converters for processing audio signals. For example, the audio signals from a microphone may be desired in the audio signal played back by a speaker in a factory and/or test environment. The loopback path 319 may also perform sample rate conversion so that the signals looped back to a downlink path may be at an acceptable sampling rate. For example, the ADC signal 235 may be 3 level signal sampled at 26 MHz while a DAC communicatively coupled to an audio output device may accept 23-bit signal sampled at 6.5 MHz. Additional details of the loopback path 319 are described below with respect to FIG. 4.

The dual voice path 321 may comprise suitable circuitry, logic, and/or code that may be operable to independently process each of a pair of audio signals received from the routing switch 217. In this regard, the dual voice path 321 may comprise a plurality of filters and/or sample rate converters for processing audio signals for conveyance to the digital signal processor 154. In this regard, audio signals selected for processing in the dual voice path 321 may be down-sampled to voice band signals with a sample rate of, for example, 17-bits at 8 kHz or 16 kHz. Although a dual voice path is depicted, aspects of the invention may be extended to simultaneously process three or more voice band signals.

The high quality audio path 323 may comprise suitable circuitry, logic, and/or code that may be operable to independently process each of a pair of audio signals received from the routing switch 317. In this regard, high quality audio path 323 may comprise a plurality of filters and/or sample rate converters for processing high quality audio signals, such as 23-bit audio signals sampled at 48 kHz, for conveyance to the digital signal processor 154.

In operation, the analog microphone 301 and the headset auxiliary microphone 303 may be operable to receive sound signals and convert them into electrical signals that may be communicated to the analog input select switch 307. The analog input select signal may define which analog signal may be communicated to the PGA 311 for amplification. The signal amplified by the PGA 311 may be communicated to the ADC 313 for conversion to a digital representation. The digital signal generated by the ADC 313 and the digital signals from the dual digital microphone may be communicated to the digital input routing switch 317 which may be configured by the digital input routing select signal to communicate the digital signals to one or more of the loopback path 319, the dual voice path 321, and the high quality audio path 323. The loopback path 319 may process a plurality of signals from the routing switch 317 for output via one or more local audio output devices, such as the speakers 170 or via the external headset port 166. The dual voice path 321 may select two of the signals from the routing switch 317 and process each signal independently for conveyance to the DSP 154. The high quality audio path 323 may select two of the signals from the routing switch 317 and process each signal independently for conveyance to the DSP 154. Accordingly, the high quality audio path 323 may apply a digital gain to audio signals such that voltage and/or power levels of audio signals from different sources may be made approximately equal prior to conveying the audio signals to the DSP 154. Processed signals conveyed to the DSP 154 may subsequently be transmitted to a remote wireless device via the transmitter 152 and/or the BT and/or USB subsystem 162.

Figure 4:
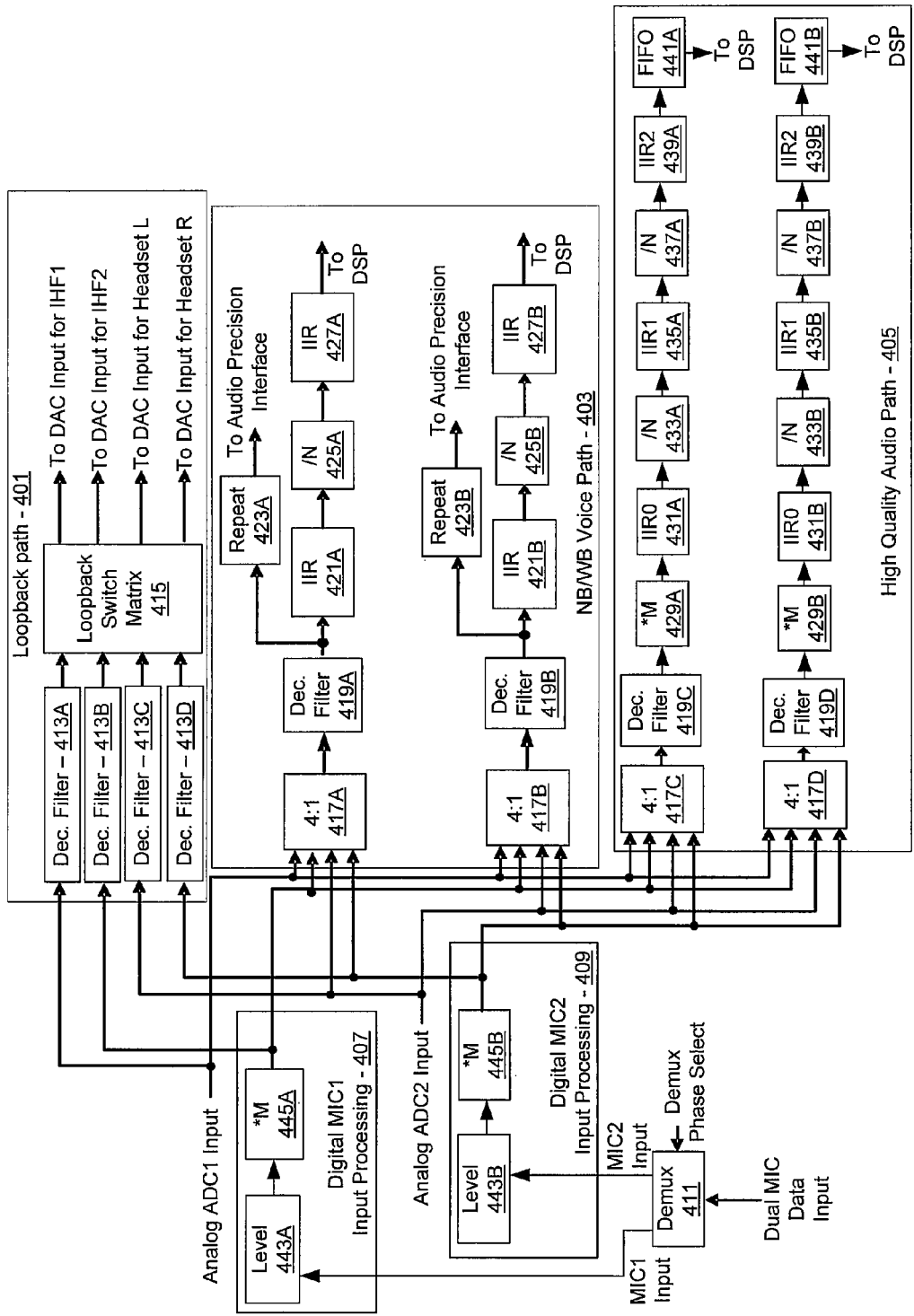
FIG. 4 is a block diagram illustrating exemplary digital audio processing hardware, in accordance with an embodiment of the invention.

FIG. 4 is a block diagram illustrating exemplary digital audio processing hardware, in accordance with an embodiment of the invention. Referring to FIG. 4, there is shown a loopback path 401, a dual voice path 403, a high quality audio path 405, digital microphone processing blocks 407 and 409, and a demultiplexer 411.

The loopback path 401 may be similar to or the same as the loopback path 319 described with respect to FIG. 3. The loopback path 401 may comprise decimation filters 413A-413D, and a loopback switch matrix 415.

The dual voice path 403 may be similar to or the same as the dual voice path 321 described with respect to FIG. 3. The dual voice path 403 may comprise the 4:1 select blocks 417A and 417B, decimation filters 419A and 419B, infinite impulse response (IIR) filters 421A, 421B, 427A, and 427B, repeat blocks 423A and 423B, and decimate-by-N blocks 425A and 425B.

The high quality audio path 405 may be similar to or the same as the high quality path 323 described with respect to FIG. 3. The high quality audio path 405 may comprise, 4:1 select blocks 417C and 417D, decimation filters 419C and 419D, repeat-by-M blocks 429A and 429B, IIR0 filters 431A and 431B, decimate-by-N blocks 433A, 433B, 437A, and 437B, IIR1 filters 435A and 435B, IIR2 filters 439A and 439B, and FIFO blocks 441A and 441B.

The digital mic1 input processing block 407 may comprise a level block 443A and a repeat-by-M block 445A. The digital mic2 input processing block 409 may comprise a level block 443B and a repeat-by-M block 445B.

The demultiplexer (demux) 411 may comprise suitable circuitry, logic, and/or code that may be operable to separate two signals from a single received signal. The demux 411 may receive as inputs an output signal generated by a dual digital microphone and a demux phase select signal. The phase select signal may be utilized to configure the demux 411 to communicate the separate signals to appropriate output ports.

The decimation filters 413A-413D may comprise suitable circuitry, logic, and/or code that may enable down-conversion of the sampling frequency of a received signal by an integer value. The decimation filters 413A-413D may be communicatively coupled to the loopback switch 415. The loopback switch 415 may comprise suitable circuitry, logic, and/or code that may communicatively couple each of the signals generated by the decimation filters 413A-413D to desired outputs, such as a DAC input for IHF speakers or headset speakers, for example.

The 4:1 select blocks 417A, 417B and 417C, 417D may comprise suitable circuitry, logic, and/or code that may be operable to select one of the plurality of input signals for processing by the dual voice path 403 and the high quality audio path 405, respectively. In this manner, multiple signals may be processed by any one of the signal paths 401, 403, and 405. Although a 4:1 select block is depicted, aspects of the invention may enable extending capabilities of each processing block to process three or more audio signals.

The decimation filters 419A-419D may comprise suitable circuitry, logic, and/or code that may enable down-converting the sampling frequency of a received signal by an integer value. The decimation filters 419A-419D may comprise cascaded-integrate-comb (CIC) filters, for example, and may be utilized to convert a signal frequency down to 40 or 80 or 400 kHz, for example. The decimation filters 419A-419D may also comprise a digital gain control. Additional details of an exemplary decimation filter 419 are described below with respect to FIGS. 5-7.

The IIR filters 421A, 421B, 427A, 427B, 431A, 431B, 435A, 435B, 439A, and 439B may comprise suitable circuitry, logic, and/or code that may be operable to filter received signals to obtain a desired frequency response. The IIR filters 421A, 421B, 427A, 427B, 431A, 431B, 435A, 435B, 439A, and 439B may comprise 2-, 3-, and/or 5-biquad filters, and may compensate for non-ideal microphone response, for example.

The repeat blocks 423A and 423B may comprise suitable circuitry, logic, and/or code that may be operable to upconvert a 40 kHz signal to an 80 kHz for communication to an audio precision interface. The output signal may comprise an 80 kHz, 17 bit data stream, for example.

The decimate-by-N blocks 425A, 425B, 433A, 433Bm 437A, and 437B may comprise suitable circuitry, logic, and/or code that may divide the sampling frequency of the received signals by an integer N, by outputting 1 sample for every N input samples. Similarly, the repeat-by-M blocks 429A, 429B, 445A, and 445B may comprise suitable circuitry, logic, and/or code that may multiply the sampling frequency of the received signals by an integer M, by repeating every input sample M−1 times. In this manner, digital samples received at different sampling frequencies may be converted to a desired sampling frequency for subsequent processing. The values for M and N may be different for any given decimate-by-N or repeat-by-M blocks, depending on the desired sampling frequency.

The FIFO blocks 441A and 441B may comprise suitable circuitry, logic, and/or code that may be operable as a buffer and temporarily store data before being communicated to a DSP, such as the DSP 154 described with respect to FIG. 2.

The level conversion blocks 443A and 443B may comprise suitable circuitry, logic, and/or code that may convert the number of levels of the received signal. For example, the level conversion blocks 443A and 443B may convert received signals from 3.25 MHz, 2-level signal to a 3.25 MHz, 3-level signal.

In operation, a digital microphone, such as the dual digital microphone 305, described with respect to FIG. 3, may generate a digital signal that may be demultiplexed by the demux 411 to generate two signals, the MIC1 and MIC2 inputs. The MIC1 and MIC2 inputs may be converted to a 3-level signal, for example, by the level conversion blocks 443A and 443B. The converted signals may be upconverted by the repeat-by-M blocks 445A and 445B, creating two of the fours signals that may be selected for processing by the loopback path 401, the dual voice path 403, and/or the high quality audio path 405. The ADC1 and ADC2 input signals may comprise two additional signals that may be selected.

The loopback path 401 may be utilized to communicate any of the four inputs, such as from digital or analog microphones, stereo line-in, and FM signals to a delta-sigma DAC for conveyance to an audio output device such as the speakers 170 or a headset via the headset port 166. To achieve this, for example, a 3-level 26 MHz signal may be down-sampled by a factor of 4 to 6.5 MHz 23-bit by the decimation filters 413A-413D, and then may be routed to a delta-sigma DAC.

In an exemplary embodiment of the invention, one or more 3-level 26 MHz signals may be selected in the dual voice path 403 and/or the high quality audio processing path 405 from the plurality of input sources. The selected signals may be down-sampled to 40 KHz/80/400 kHz. The down sampling may be performed by the CIC decimation filters 419. The decimation ratio of each of the CIC decimation filters 419 may be determined based on the final ADC output sampling rate (8 kHz, 16 kHz, or 48 kHz). The decimation filters 419A and 419B may be dependent on the final ADC output sampling rate such that the frequency response for a higher sampling rate (16 kHz) may be greatly improved. Prior to outputting the down-sampled signals, the decimation filters 419 may adjust voltage and/or power levels of the down-sampled signals. In this regard, settings, such as output sampling frequency and output voltage and/or power levels, of each of the decimation filters 419 may be configured, possibly in real-time, via one or more control signals from, for example, the processor 156, the memory 158, and/or the DSP 154. In the dual voice path 403, the output of each decimation filter 419 may be communicated to an Audio Precision interface via a repeat block 423 and/or to an IIR filter 421. In the high quality audio path 405, the output of each decimation filter 419 may be communicated to a repeat-by-M block 429. The high quality voice path 405 may comprise two parallel and identical processing branches, and the input to each branch may be selected independently. Although each branch may be identical, the invention is not so limited, and in some embodiments of the invention, the branches may be different. Notwithstanding, the sample rate conversion ratios and filter coefficients may be configured separately for each branch. Thus, regardless of the audio signal selected for processing in each branch, the output of each branch of the high quality audio path 405 may be, for example, a 16 or 18-bits audio signal sampled at 48 kHz.

Figure 5:
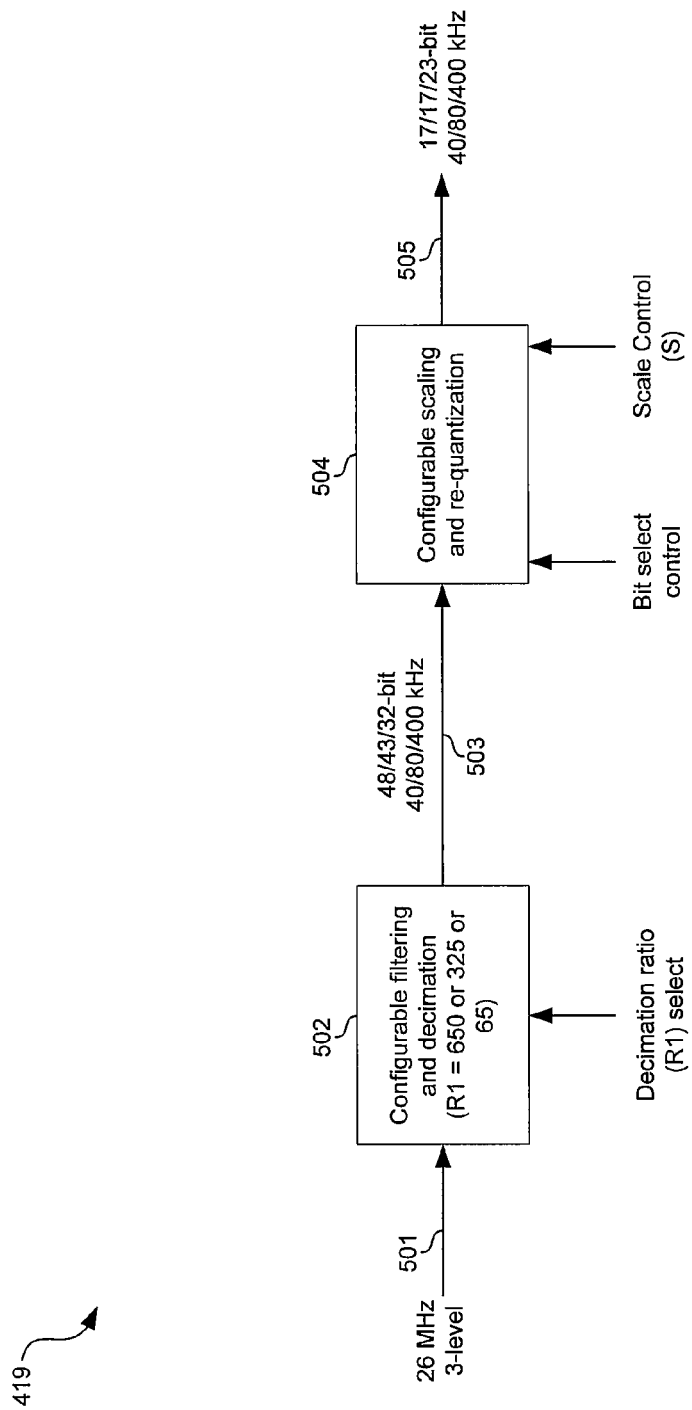
FIG. 5 is a block diagram illustrating an exemplary decimation filter, in accordance with an embodiment of the invention.

FIG. 5 is a block diagram illustrating an exemplary decimation filter, in accordance with an embodiment of the invention. Referring to FIG. 5 the decimation filter may comprise a configurable filtering and decimation block 502 and a configurable scaling and requantization block 504.

The configurable filtering and decimation block 502 may comprise suitable logic, circuitry, and/or code that may be operable to reduce the sample rate of an audio signal and to filter the down-sampled audio signal. The configurable filtering and decimation block 502 may be configurable via one or more signals from, for example, the processor 156, the memory 158, and/or the DSP 154 described with respect to FIG. 1. In this regard, a decimation ratio and/or one or more filter coefficients may be configured based on the sampling frequency of the input signal 501 and a desired sampling frequency of the output signal 505. In an exemplary embodiment of the invention, a 26 MHz 3-level signal 501 may be input to the filtering and decimation block 502 and the signal 503 may be a 48-bit signal with a 40 kHz sampling frequency, a 43-bit signal with 80 kHz sampling frequency, or a 32-bit signal with a 400 kHz sampling frequency.

The configurable scaling and requantization block 504 may comprise suitable logic, circuitry, and/or code that may be operable to scale signal 503 to generate the output signal 505. The gain, A, applied by the configurable scaling and requantization block 504 may be given by $$A = (1 + S/2^N) \qquad \text{EQ. 1}$$

where N may be selected based on a desired gain resolution (higher N may result in increased gain resolution) and S may be a value between 0 and $(2^N-1)$. In an exemplary embodiment of the invention, N may be pre-configured to be 8 by system designers and S may be dynamically configured to be between 0 and 255 via one or more signals from, for example, the processor 156, the memory 158, and/or the DSP 154 described with respect to FIG. 1. The configurable scaling and requantization block 504 may compensate for non-full scale operation of the ADC 313 (FIG. 3). In this regard, the configurable scaling and requantization block 504 may enable utilization of the full range of audio signal bitwidth.

Figure 6:
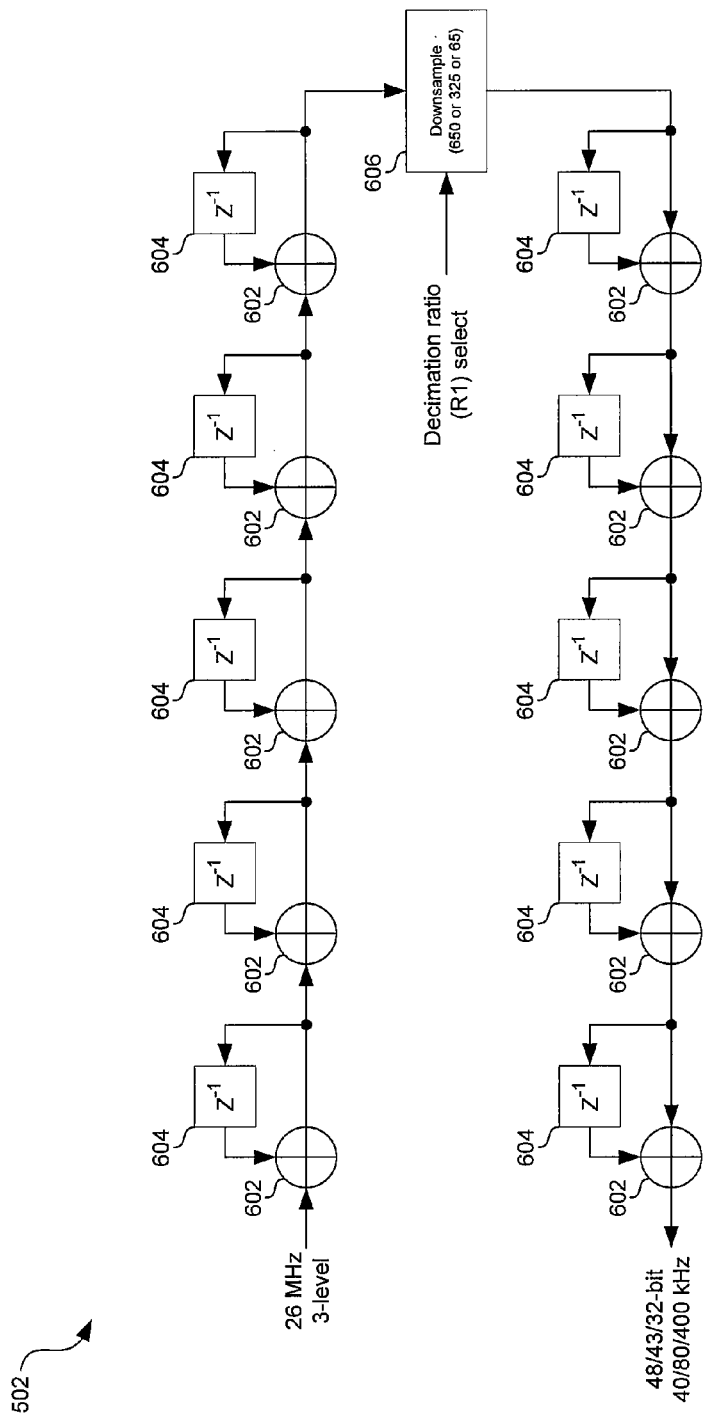
FIG. 6 is a block diagram of an exemplary configurable CIC decimation filter, in accordance with an embodiment of the invention.

FIG. 6 is a block diagram of an exemplary configurable CIC decimation filter, in accordance with an embodiment of the invention. Referring to FIG. 6, the configurable filtering and decimation block 502 may comprise a plurality of adders 602, a plurality of delay elements 604, and a down sampler 606.

Each of the adders may comprise suitable logic, circuitry, and/or code that may be operable to sum two or more digital audio signals. Each of the delay elements 604 may comprise suitable logic, circuitry, and/or code that may be operable to delay an audio signal by an integer multiple of the sampling period. In various embodiments of the invention, one or more scaling coefficients of one or more of the adders 602 and/or delay elements 604 may be configurable. The down sampler 606 may comprise suitable logic, circuitry, and/or code that may be operable to reduce the sampling frequency of an audio signal. In an exemplary embodiment of the invention, the decimation ratio of the down-sampler may be configured to be 650, 325, or 65.

Figure 7:
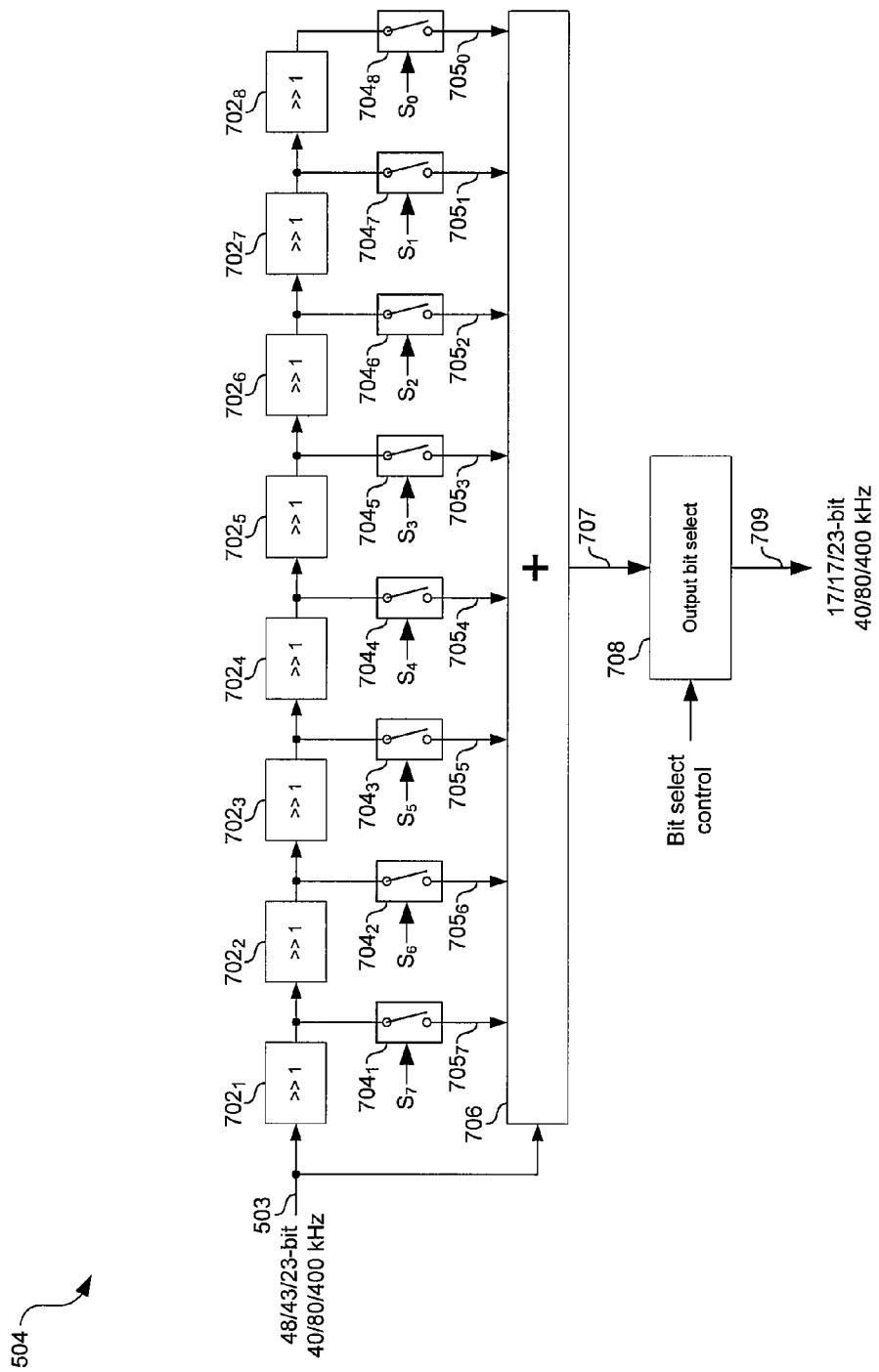
FIG. 7 illustrates an exemplary configurable scaling and re-quantization block, in accordance with an embodiment of the invention.

FIG. 7 illustrates an exemplary configurable scaling and re-quantization block, in accordance with an embodiment of the invention. Referring to FIG. 7 the configurable scaling and re-quantization block 504 may comprise a plurality of bit-shift 702, a plurality of switching elements 704, an adder 706, and an output bit select circuit or module 708.

Each bit-shift $702_j$ may each comprise suitable logic, circuitry, and/or code that may be operable to shift an audio sample by 1 bit. Each switching element $704_j$ may be operable to communicatively coupled/decouple an output of bit-shift $702_j$ to/from the adder 706. The adder 706 may comprise suitable logic, circuitry, and/or code that may be operable to sum a sample of the input audio signal 503 with one or more of the signals 705.

The output bit select circuit or module 708 may comprise suitable logic, circuitry, and/or code that may be operable to select a portion of the sum 707 output by the adder 706. In this regard, the output bit select circuit or module 708 may select a window of 'X' bits from a 'Y' bit value, where Y>X. In an exemplary embodiment of the invention, the sum 707 may be in 2's complement representation and sliding the selection window one bit to the right may effectively increase the sample value by approximately a factor of 2. Least significant bits falling outside the selection window may be rounded and truncated and most significant bits falling outside the window may be clipped. In instances that any of the MSBs outside the selection window are a different value then the first bit within the selection window, the value of the output 709 may saturate to $(2^X-1)$ if the sum 707 is positive or $(-2^X)$ if the sum 707 is negative. In this manner, the output bit select circuit or module 708 may act as a course gain scaling block with 6 dB gain step adjustment.

In operation, for a given sample of the audio signal 503, the sample value may be right shifted by 'j' bits at the output of bit-shift 702j, where j may be a positive greater than 1. Subsequently, for each asserted bit $S_j$ of the scaling factor S, the value of the corresponding bit-shift $702_j$ may be added to the sample value of the signal 503. The output of the adder 706 may thus be of the same or larger bitwidth as the audio signal 503. Accordingly, the output bit select circuit or module 708 may then select the proper 17-bit or 23-bit data based on, for example, whether the configurable scaling and re-quantization block 504 may be part of the dual voice path 403 or the high quality audio path 405.

Figure 8:
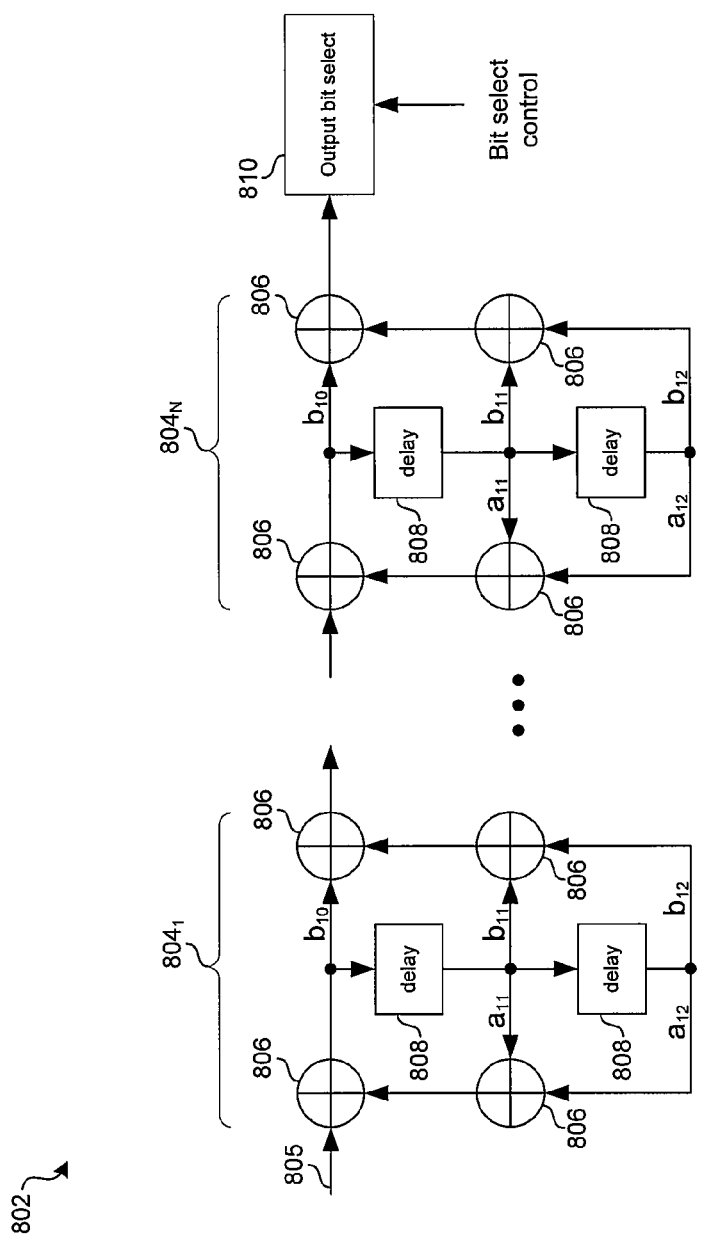
FIG. 8 is a block diagram illustrating an exemplary configurable frequency compensation filter in a hardware audio CODEC, in accordance with an embodiment of the invention.

FIG. 8 is a block diagram illustrating an exemplary configurable frequency compensation filter in a hardware audio CODEC, in accordance with an embodiment of the invention. Referring to FIG. 8, the frequency compensation filter 802 may comprise a plurality of biquads $804_1, \ldots, 804_N$, and an output bit select block 810. Each biquad 804 may comprise four adders 806, and two delay elements 808.

The filter 802 may be similar to or the same as one or more of the IIR filters 431, 435, and 439 of the high quality audio path 405 described with respect to FIG. 4.

Each adder 806 may comprise suitable logic, circuitry, and/or code that may be operable to add two signals to generate a third signal. Each adder input may be weighted by a coefficient and the coefficients may be configurable by a system designer or via one or more control signals from the DSP 154, the processor 156, and/or the memory 158. In this regard, the coefficients $b_{10}$, $a_{11}$, $b_{11}$, $a_{12}$, and $b_{12}$ may be pre-configured or may be configured dynamically and/or in real-time. Additionally, coefficients of each of the biquads $804_1, \ldots 804_N$ may be independent from one another.

Each delay element 808 may comprise suitable logic, circuitry, and/or code that may be operable to delay an audio signal by a sample period. In this regard, each delay element 808 may, for example, comprise a register clocked at the sample rate of the input signal 805.

The output bit select circuit or module 708 may comprise suitable logic, circuitry, and/or code that may be operable to select a portion of the sum 707 output by the adder 706. In this regard, the output bit select circuit or module 708 may select a window of 'X' bits from a 'Y' bit value, where Y>X. In this manner, the 'X' bits may be selected based on an audio input which generated the audio signal such that the dynamic range of the 'X' bit signal may be optimized. In various embodiments of the invention, the selection window may be determined based on a type of audio input device, a class of audio input device, the manufacturer of the audio input device, and/or the model of the audio input device. Exemplary types of audio input devices may comprise analog microphones, digital microphones, and stereo line-in. Exemplary classes of audio input devices may indicate a dynamic range, signal bandwidth, or power levels and/or requirements of the input device. The manufacturer and/or model of an audio input device may be determined via one or more identifiers which may, for example, comprise one or more discrete signals and/or one or more data streams.

For an audio signal with large and/or rapid swings, the selection window may encompass a larger number of MSBs and less LSBs. For example, the selection window may encompass bits 48 through 31 of a 58-bit signal. Conversely, for a signal with small and/or slow swings, the selection window may encompass more LSBs and fewer MSBs. For example, the selection window may encompass bits 41 through 24 of a 58-bit signal.

In various embodiments of the invention, the filter 802 may be utilized for several purposes. For example, the filter 802 may be configured to provide frequency compensation for an audio input device from which an audio signal originated or may provide anti-aliasing when down-sampling an audio signal and the filter coefficients may be configured accordingly. In this regard, the coefficients may be configured dynamically and/or in real-time as audio input devices become active and/or as sampling frequencies of signals change.

Figure 9:
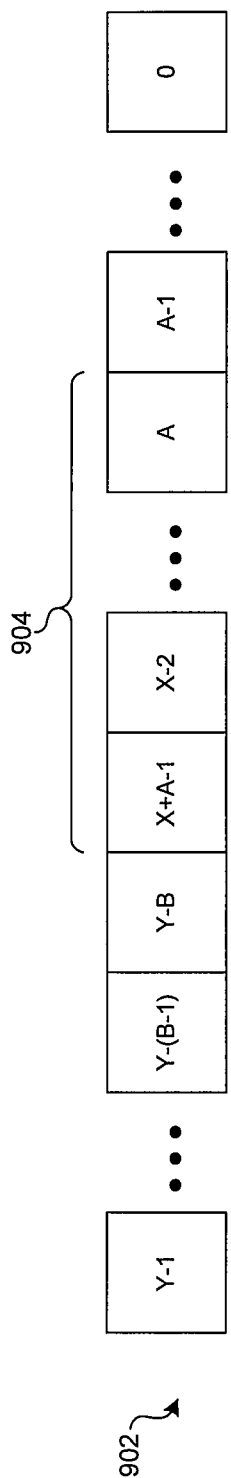
FIG. 9 illustrates operation of a bit select circuit or module, in accordance with an embodiment of the invention.

FIG. 9 illustrates operation of a bit select circuit or module, in accordance with an embodiment of the invention. Referring to FIG. 9 there is shown a Y-bit audio sample 902 from which a window 904 of X-bits may be selected. In this regard, the relationship between 'X' and 'Y' may be as follows:

$$Y=X+A+B \qquad \text{EQ. 2}$$

where 'A' may be the number of least significant bits rounded off and 'B' may be the number of most significant bits that may be clipped, with the resulting value saturating if applicable. For example, 'Y' may be 23, 'X' may be 17, and the window may be positioned such that A may be 4 and B may be 2. Accordingly, from the original bits 0 to 22, the 17-bit output may comprise bits 4 to 20.

Aspects of a method and/or system for processing high quality audio in a hardware audio CODEC for audio transmission are provided. In an exemplary embodiment of the invention, an audio signal 501 may be down-sampled via a cascaded plurality of filters 419, 431, 435, 439 and sample rate converters 429, 433, and 437 in the hardware audio CODEC 164. Additionally, a portion of each sample 902 of the audio signal 501 may be selected based on an origin of the audio signal 501. The selected portion 904 of each sample 902 of the audio signal 501 may comprise 16 or 18 bits. In an exemplary embodiment of the invention, the selected portion may be determined based on a type, a class, a manufacturer identifier, and/or a model identifier of the origin the audio signal 501. Exemplary origin types may comprise a digital microphone 305, an analog microphone 301, an auxiliary microphone 303, and a line-in 306. Exemplary classes may indicate a dynamic range, signal bandwidth, or power levels of the input device. Coefficients of one or more of the filters 419, 431, 435, 439 may be configured based on the origin of the audio signal. The filters may comprise one or more IIR filters. One or more of the filters 419, 431, 435, 439 may comprise one or more cascaded biquads. One or more of the sample rate converters 419 may comprise one or more CIC decimation filters. The audio signal 501 may be downsampled to 48 kHz.

Certain embodiments of the invention may comprise a machine and/or computer readable storage having stored thereon, a machine code and/or a computer program having at least one code section for processing high quality audio in a hardware audio CODEC for audio transmission, the at least one code section being executable by a machine and/or a computer for causing the machine and/or computer to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. One embodiment utilizes a commercially available processor, which may be implemented external to an ASIC implementation of the present system. Alternatively, in an embodiment where the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing an audio signal in an audio processing system, the method comprising:
   determining, from a plurality of audio input devices including a first audio input device and a second audio input device, an originating audio input device that originated the audio signal;
   determining, based on the originating audio input device, a path of the audio processing system to process the audio signal, wherein the path is a dual voice path or a high quality audio path;
   configuring a filter in the path to select a window of bits from a plurality of sample bits of a sample of the audio signal, wherein a size and a position of the window of bits is determined based on the originating audio input device;
   adjusting, based on a sampling frequency of the audio signal, a filtering and decimation module of the filter to configure a decimation ratio of the filter; and
   adjusting a coefficient of the filter based on the originating audio input device and the sampling frequency.

2. A system for processing a plurality of audio signals, the system comprising:
   a dual voice audio processing path coupled to an audio interface;
   a high quality audio processing path; and
   a processor coupled to the dual voice audio processing path and the high quality audio processing path, wherein the processor is configured to:
      determine, from a plurality of audio input devices including a first audio input device and a second audio input device, an originating audio input device that originated an audio signal in the plurality of audio signals,
      configure a filter in the dual voice audio processing path or the high quality audio processing path to select a window of bits from a plurality of sample bits of a sample of the audio signal, wherein a size and a position of the window of bits is determined based on the originating audio input device,
      adjust, based on a sampling frequency of the audio signal, a filtering and decimation module of the filter to configure a decimation ratio of the filter, and
      adjust a coefficient of the filter based on the originating audio input device and the sampling frequency.

3. The system according to claim 2, wherein the filter is configured to select the window of bits based on a type, a class, a manufacturer identifier, and/or a model identifier corresponding to the originating audio input device.

4. The system according to claim 3, wherein the type comprises one of a digital microphone, an analog microphone, and a line-in jack.

5. The system according to claim 3, wherein the class indicates at least one of a speed and a power level corresponding to the originating audio input device.

6. The system according to claim 3, wherein the class indicates a speed associated with the originating audio input device.

7. The system according to claim 3, wherein the class indicates a dynamic range associated with the originating audio input device.

8. The system according to claim 3, wherein the class indicates a signal bandwidth associated with the originating audio input device.

9. An audio processing system configured to receive a plurality of audio signals from a plurality of audio input devices including a first audio input device and a second audio input device, the audio processing system comprising:
   a dual voice path coupled to an audio interface, wherein the dual voice path is configured to down-sample the plurality of audio signals to voice band signals;
   a high quality audio path configured to process high quality audio signals in the plurality of audio signals;

a loopback path, wherein the loopback path is configured to provide a plurality of audio output signals to a plurality of audio output devices; and a processor coupled to the dual voice path, the high quality audio path, and the loopback path, wherein the processor is configured to:

determine, from the plurality of audio input devices, an originating audio input device that originated an audio signal in the plurality of audio signals, configure a filter in the dual voice path or the high quality audio path to select a window of bits from a plurality of sample bits of a sample of the audio signal, wherein a size and a position of the window of bits is determined based on the originating audio input device, adjust, based on a sampling frequency of the audio signal, a filtering and decimation module of the filter to configure a decimation ratio of the filter, and adjust a coefficient of the filter based on the originating audio input device and the sampling frequency.

10. The audio processing system of claim 9, further comprising a sample rate converter coupled to the filter.

11. The audio processing system of claim 9, wherein the processor is configured to:

determine the originating audio input device based on at least one of a type, a class, a manufacturer identifier, and a model identifier corresponding to the originating audio input device.

12. The audio processing system of claim 11, wherein the type comprises one of a digital microphone, an analog microphone, and a line-in jack.

13. The audio processing system of claim 11, wherein the class indicates a speed associated with the originating audio input device.

14. The audio processing system of claim 11, wherein the class indicates a dynamic range associated with the originating audio input device.

15. The audio processing system of claim 11, wherein the class indicates a power level associated with the originating audio input device.

16. The audio processing system of claim 11, wherein the class indicates a signal bandwidth associated with the originating audio input device.

17. The audio processing system of claim 9, wherein the processor is further configured to:

determine a second audio signal;

match voltage, power levels, and/or sampling frequencies of the audio signal and the second audio signal;

determine, from the plurality of audio input devices, a second originating audio input device that originated the second audio signal; and configure a second filter in the dual voice path or the high quality audio path to select a second window of bits of a second sample of the second audio signal based on the second originating audio input device.

18. The audio processing system of claim 9, wherein the filter comprises a bit select module, and wherein the bit select module is configured to select the window of bits.

19. The audio processing system of claim 9, wherein the filter is configured to select a 17 bit window of bits or a 23 bit window of bits based on whether the filter is included in the dual voice path or the high quality audio path of the audio processing system.

20. The audio processing system of claim 9, wherein a scaling and re-quantization module of the filter comprises:

a plurality of bit shift modules configured to shift the audio signal;

an adder coupled to the plurality of bit shift modules; and an output bit select module coupled to the adder, wherein the output bit select module is configured to select the window of bits.

21. The audio processing system of claim 9, wherein the dual voice path comprises a first select block, and wherein the high quality audio path comprises a second select block.

22. The audio processing system of claim 9, wherein the dual voice path comprises a first repeat block, and wherein the high quality audio path comprises a second repeat block.

23. The audio processing system of claim 22, wherein the first repeat block is configured to upconvert a received signal for communication to the audio interface.

24. The audio processing system of claim 22, wherein the dual voice path further comprises:

a plurality of decimation filters, wherein an output of each decimation filter in the plurality of decimation filters is communicated to the first repeat block.

25. The audio processing system of claim 22, wherein the second repeat block is a repeat-by-M block.

26. The audio processing system of claim 9, wherein the dual voice path comprises:

a select block;

a decimation filter coupled to an output of the select block;

a repeat block coupled to:

an output of the decimation filter, and an input of an audio interface; and an infinite impulse response (IIR) filter coupled to:

an output of the decimation filter, and an input of a digital signal processor.

27. The audio processing system of claim 9, wherein the high quality audio path comprises:

a select block;

a decimation filter coupled to an output of the select block;

a repeat block coupled to an output of the decimation filter; and an infinite impulse response (IIR) filter coupled to:

an output of the repeat block, and an input of a digital signal processor.

28. The audio processing system of claim 9, wherein the loopback path comprises:

a plurality of decimation filters; and a loopback switch matrix coupled to:

the plurality of decimation filters, and a plurality of inputs of the plurality of audio output devices.

29. The system of claim 2, wherein the dual voice path comprises a repeat block, and wherein the repeat block is configured to upconvert a received signal for communication to the audio interface.

30. The system of claim 2, wherein the dual voice path comprises a plurality of decimation filters, and wherein each decimation filter in the plurality of decimation filters is coupled to an input of a repeat block.

31. The method of claim 1, wherein determining the originating audio input device comprises:

determining a type, a class, a manufacturer identifier, and a model identifier corresponding to the audio signal.

* * * * *